US006882219B2

(12) United States Patent
Leedham

(10) Patent No.: US 6,882,219 B2
(45) Date of Patent: Apr. 19, 2005

(54) HIGH FREQUENCY SWITCH-MODE POWER AMPLIFIER

(75) Inventor: Robert Leedham, Cambridge (GB)

(73) Assignee: Ling Dynamic Systems, Hertfordshire (GB)

( * ) Notice: Subject to any disclaimer, the term of this patent is extended or adjusted under 35 U.S.C. 154(b) by 40 days.

(21) Appl. No.: 10/240,110

(22) PCT Filed: Mar. 30, 2001

(86) PCT No.: PCT/GB01/01415

§ 371 (c)(1),
(2), (4) Date: Apr. 4, 2003

(87) PCT Pub. No.: WO01/76061

PCT Pub. Date: Oct. 11, 2001

(65) Prior Publication Data

US 2003/0151459 A1 Aug. 14, 2003

(51) Int. Cl.⁷ .............................. H03F 3/38; H03F 3/217

(52) U.S. Cl. ........................................ 330/10; 330/251

(58) Field of Search .............................. 330/10, 207 A, 330/251

(56) References Cited

U.S. PATENT DOCUMENTS 6,452,366 B1 * 9/2002 Hwang ........................ 323/225
6,552,606 B1 * 4/2003 Veltman et al. ............... 330/10

FOREIGN PATENT DOCUMENTS

| EP | 0833443 | 4/1998 |
| EP | WO0033448 | 6/2000 |
| EP | 01 917 249.3 | 3/2003 |
| FR | 2404337 | 4/1979 |
| FR | 2419610 A | 10/1979 |
| WO | WO 9515612 | 6/1995 |

OTHER PUBLICATIONS

XP001055906 Karsten Nielsen, Parallel Phase Shifted Carrier Pulse Width Modulation (PSCPWM)—A Novel Approach to Switching Power Amplifier Design, Mar. 22, 1997, pp. 1–26.

XP000800140 F.V.P. Robinson, "The Interleaved Operation of Power Amplifiers", Power Electronics and Variable Speed Dirves, 21–23, Sep. 1998, pp. 606–611.

XP010241617 Shuji Watanabe, et al., "Digitally–Controlled Optimum Current Tracking Scheme of Two–Paralleled High–Power PWM Amplifier for Magnetic Resonance Imaging", May 1997, pp. 686–691.

XP010366646 H. Takano, et al., "Multiple–Bridge PWM Current–Regulated Power Amplifier for Magnetic Resonance Imaging System and Its Feasible Digital Control Implementation", Mar. 1999, pp. 785–790.

* cited by examiner

*Primary Examiner*—Steven J. Mottola
(74) *Attorney, Agent, or Firm*—Baker & Hostetler LLP

(57) ABSTRACT

A switch-mode power amplifier circuit using high power, low distortion waveforms is connected to an electromagnetic load to provide a high degree of control over the load. The circuit comprising a plurality of half-bridge networks having outputs combined at a summation point. The half-bridge networks are switched to provide power outputs sequenced to generate an interlaced output at the summation point which is operably connected to the load so that for a given switching frequency of the networks the operational frequency of the circuit is increased. The sequencing of the half-bridge outputs to generate an interlaced output facilitates the reduction of the switching frequency of individual switching components within the half-bridges while at least maintaining the overall operational frequency of the circuit. For N half-bridges operating at $f$kHz, the overall operational frequency of the circuit is N$f$kHz. Alternatively, the switching frequency of individual switching elements of a system operating at $f_o$kHz may be reduced by a factor of N. A feedback signal generated across the load is included at the summation point and is optionally augmented to decrease distortion.

18 Claims, 5 Drawing Sheets

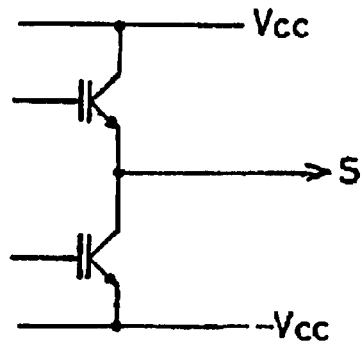
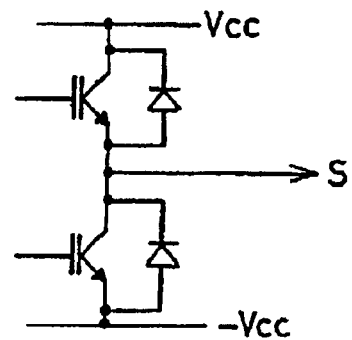
Fig. 5a            Fig. 5b
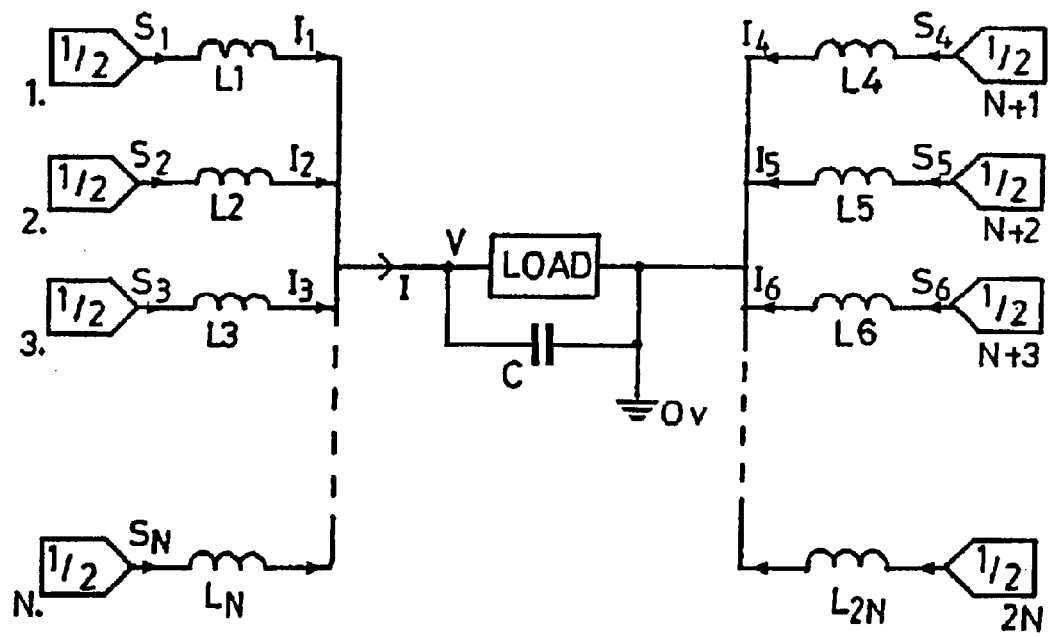
Fig. 6

US 6,882,219 B2

HIGH FREQUENCY SWITCH-MODE POWER AMPLIFIER

FIELD OF THE INVENTION

The present invention relates to power amplifiers adapted for driving electromagnetic loads including audio loudspeakers, motors and signal generating devices for vibration and acoustic testing. More particularly, the invention relates to switch-mode power amplifiers for use in vibration testing.

BACKGROUND OF THE INVENTION

Power amplifiers for use in driving, for example, electro-dynamic shakers must be capable of stable operation with a wide range of electrical loads, offer low distortion, make efficient use of electrical power, be compact in design and allow for computer control.

The use of switch-mode power technology in such amplifiers provides many advantages over linear amplification techniques and are available presently in a range of 5 to 300 kVA. The use of switch-mode power technology dramatically improves amplifier efficiency over linear amplifiers, thus reducing power losses. This allows air cooling of semi-conductor heatsinks, as opposed to water cooling. A reduced output semi-conductor component count for switch-mode designs increases reliability also. By using computer operation and control of switching modulations, lower total harmonic distortion figures may be established.

A standard switch-mode amplifier approach is to use a single half-bridge at high frequency (for examples 150 kHz). To reduce distortion from the amplifier a feedback path is applied. The amount of feedback which can be applied however is limited by the switching frequency of the individual switching elements. To obtain lower distortion a higher switching frequency should be used as this allows more feedback. However, in the half-bridge topology, as the switching frequency increases the losses in the power switches increase. This reduces efficiency. Specialised high frequency switching elements may be used but these are inherently expensive. Thus, a compromise is established between the cost of the high frequency switching elements allowable distortion and the output power.

It is an objective of the present invention to alleviate the disadvantages associated with prior art amplification techniques and to provide a switch-mode power amplifier having a controllable high frequency output.

SUMMARY OF THE INVENTION

Accordingly, the present invention provides a switch-mode power amplifier circuit connectable to an electromagnetic load, the circuit comprising a plurality of half-bridge networks having outputs combined for summation at a summation point, the half-bridge networks being switched to provide power outputs sequenced to generate an interlaced output at the summation point which is operably connected to the load so that for a given switching frequency of the networks the operational frequency of the circuit is increased.

The sequencing of the half-bridge outputs to generate an interlaced output facilitates the reduction of the switching frequency of individual switching components within the half-bridges while at least maintaining the overall operational frequency of the circuit. For N half-bridges operating at $f$ kHz, the overall operational frequency of the circuit is $Nf$ kHz. Alternatively, the switching frequency of individual switching elements of a system operating at $f_o$ kHz may be reduced by a factor of N.

Preferably, a feedback path is provided so that a feedback signal is generated across the load. Most preferably, the summation of the half-bridge network outputs includes the feedback signal;

Conveniently, where the operating frequency of the circuit is increased, further feedback may be imposed on the circuit to reduce distortion.

Advantageously, the half-bridge networks are arranged in a push-pull configuration about the load. This configuration defines a left and right channel for which a power drive signal may be derived to generate timing signals for controlling individual switching elements of the half-bridge networks.

Preferably, a timing strategy is used to ensure current sharing between the networks.

Each half-bridge network comprises two switching elements in opposite switched states. Conveniently, the states are a high impedance state representing "OFF" and a low impedance state representing "ON".

An identical supply voltage is supplied to each half-bridge network.

The switched power outputs of the half-bridge networks are provided with an in-line inductance. Preferably, the inductance is identical for each output.

An output filter stage is provided on the circuit. Preferably at least part of the filter is shunt-connected across the load in use.

A current sensor is provided on the output of each half-bridge network so that a current error signal can be derived. The error signal is compared with a plurality of waveforms to give a timing signal to regulate the switching of the half-bridge switching elements.

The switching of the half-bridge switching elements is preferably controlled using Pulse Width Modulation (PWM) techniques.

The use of a plurality of power devices, operating an interlaced fashion, in order to increase the apparent operating frequency of the system, allows more feedback to be imposed on the system.

The invention is applicable to any system where high power, low distortion waveforms are required to drive a load, particularly an electromagnetic load, with a high degree of control.

BRIEF DESCRIPTION OF THE DRAWINGS

The invention will now be described more particularly with reference to the accompanying drawings which show, by way of example only, two embodiments of switch-mode power amplifier according to the invention. In the drawings:

FIGS. 5a and 5b are schematic circuit diagrams of half-bridge networks showing details of the switching elements;

FIG. 6 is a schematic circuit diagram of a power stage of a switch-mode amplifier according to a second embodiment of the invention having N pairs of half-bridge networks in a push-pull configuration;

DETAILED DESCRIPTION OF THE PREFERRED EMBODIMENT

Figure 1:
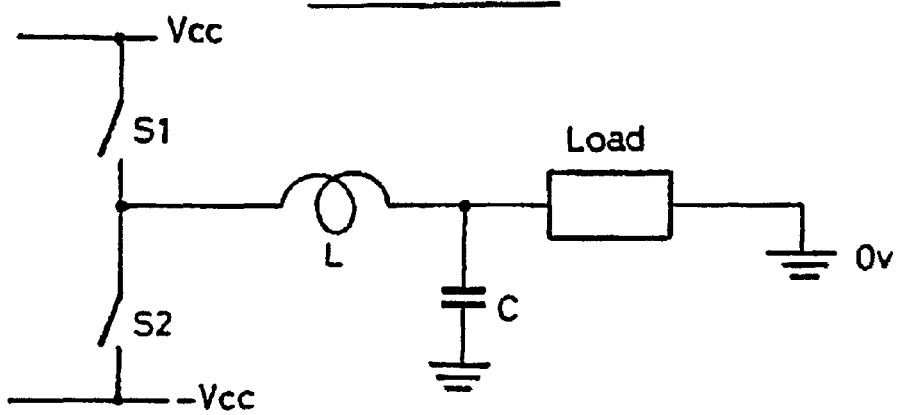
FIG. 1 is a schematic circuit diagram of a prior art standard switching amplifier incorporating a half-bridge network.
Figure 2:
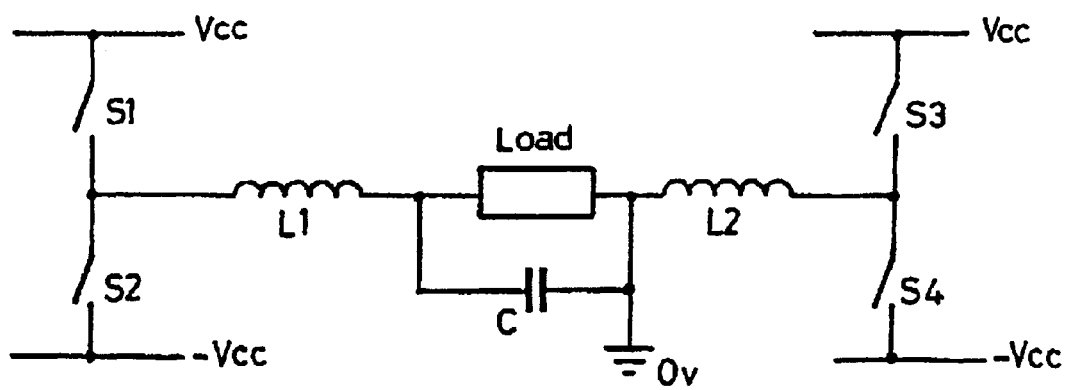
FIG. 2 is a schematic circuit diagram similar to that of FIG. 1 incorporating two half-bridge networks in a push-pull configuration.

Referring to the drawings and initially to the prior art arrangements of FIGS. 1 and 2, a standard switching amplifier comprising a single half-bridge is shown in FIG. 1. The switching elements S1, S2 are operated at high frequency, for example, 150 kHz, each element being in the opposite switched state to the other. If the first switching element S1 is conducting or in a low impedance mode, that is, "ON", then the second switching element S2 is not conducting or is in a high impedance state, that is "OFF". In the particular application considered (driving an electromagnetic load), it is important that amplifier distortion is kept to a minimum. To achieve this, feedback is applied. The amount of feedback which can be applied is limited by the switching frequency of the switching elements. An increase in the switching frequency allows more feedback to be applied and thus decreases distortion. Unfortunately, high speed switching creates heating problems, increases losses in the switches and the associated risk of component failure increases. Additionally, the high speed switching of individual components increases the incidence of radio frequency interference necessitating shielding which adds to the overall cost of the amplifier.

A push-pull configuration, as illustrated in FIG. 2, comprising a pair of half-bridges, overcomes some of the disadvantages discussed hereinabove. By adding a half-bridge comprising a usually identical pair of switching elements S3, S4 to the other side of the load, each side or channel can operate at 75 kHz giving an overall searching frequency of 150 kHz. Thus, the decreased switching speed of the switching elements S1, S2, S3, S4 ensure losses and distortion are kept to a minimum while the overall high operating frequency of the circuit allows greater feedback.

Figure 3:
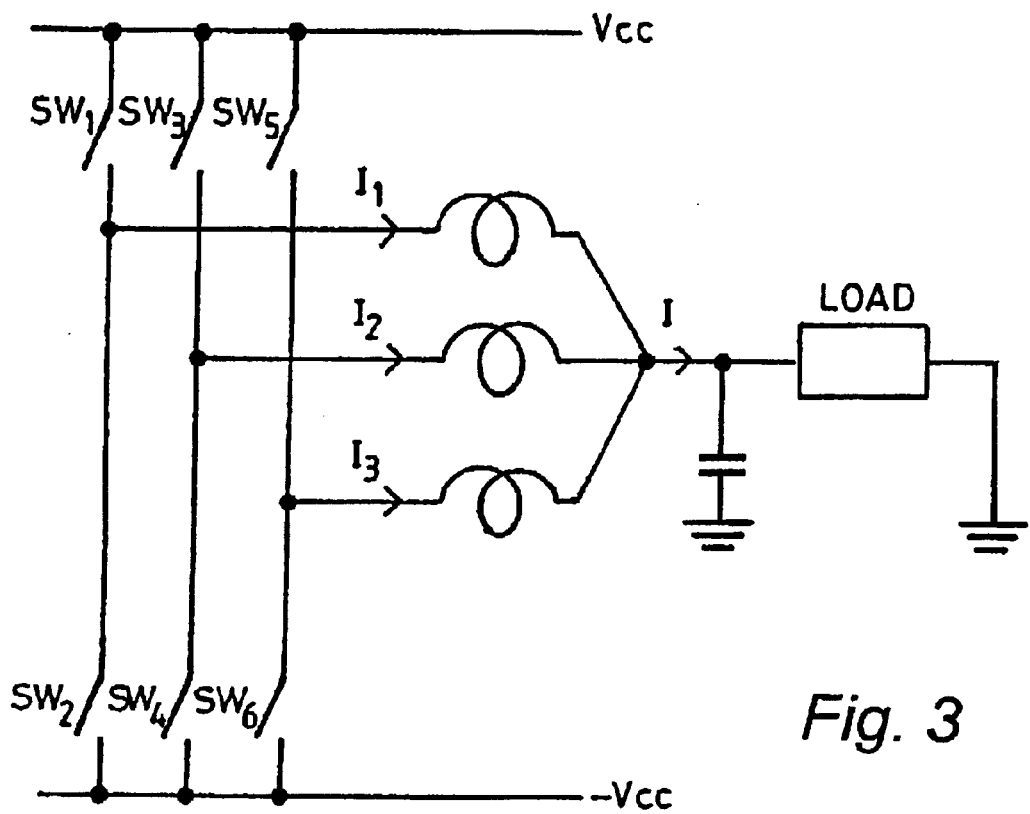
FIG. 3 is a schematic circuit diagram of a switching amplifier according to a first embodiment of the invention incorporating three half-bridge networks.
Figure 4:
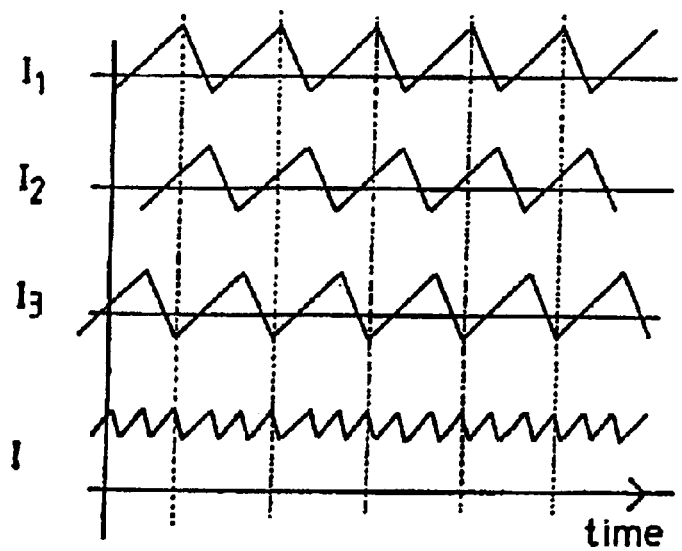
FIG. 4 is a waveform diagram illustrating the individual and combined output currents of the half-bridge networks of FIG. 3.

Referring now to FIG. 3, the first embodiment of the invention comprises a switch-mode power amplifier having three half-bridge networks, each operating at one third of the overall operating frequency required. The first half-bridge comprises switching elements $SW_1$, $SW_2$ generating a current profile $I_1$ passed through a first inductor $L_1$ to a summation point P. The second half-bridge comprises switching elements $SW_3$, $SW_4$ generating a current profile $I_2$ passed through a second inductance $L_2$ to the summation point P and the third half-bridge comprises usually identical switching elements $SW_5$, $SW_4$ generating a current profile $I_3$, passed through a third inductance $L_3$ to the summation point P. These profiles $I_1$, $I_2$, $I^3$ are combined by a summation element (not shown) to give a final current profile I, as shown in FIG. 4, which is applied to the load. From this current characteristic I, which has a higher ripple frequency than any of the source current profiles $I_1$, $I_2$, $I_3$, it will be appreciated that substantially more feedback may be applied to this circuit to reduce distortion of the amplifier.

In the above arrangement, three half-bridges each operating at a relatively low frequency of 50 kHz results in an apparent switching frequency of 150 kHz at the load. Thus, identical amplifier performance can be achieved with lower switching losses.

It will further be appreciated that by increasing the number of half-bridge networks in this circuit, the overall operating frequency can be increased with no real overall increase in distortion and that feedback can be increased to further decrease distortion. Optionally, or concurrently, the power rating of the switching elements may be increased and their operating speeds decreased. Thus, N half-bridges operating at a switching frequency off $f$ kHz gives an apparent switching frequency of N$f$ kHz. Alternatively, a required frequency of fo may be achieved by using N half-bridges operating at an Nth factor of the overall switching frequency $f$o.

FIGS. 5a and 5b are illustrations of suggested switching elements in a half-bridge configuration. Any switching element suitable for relatively high speed, high power application may be used Generally, MOSFET or IGBT elements are preferred. Gate or base current is provided to the switching elements from timing circuitry (not shown) which is normally controlled using Pulse Width Modulation (PWM) techniques.

Figure 7:
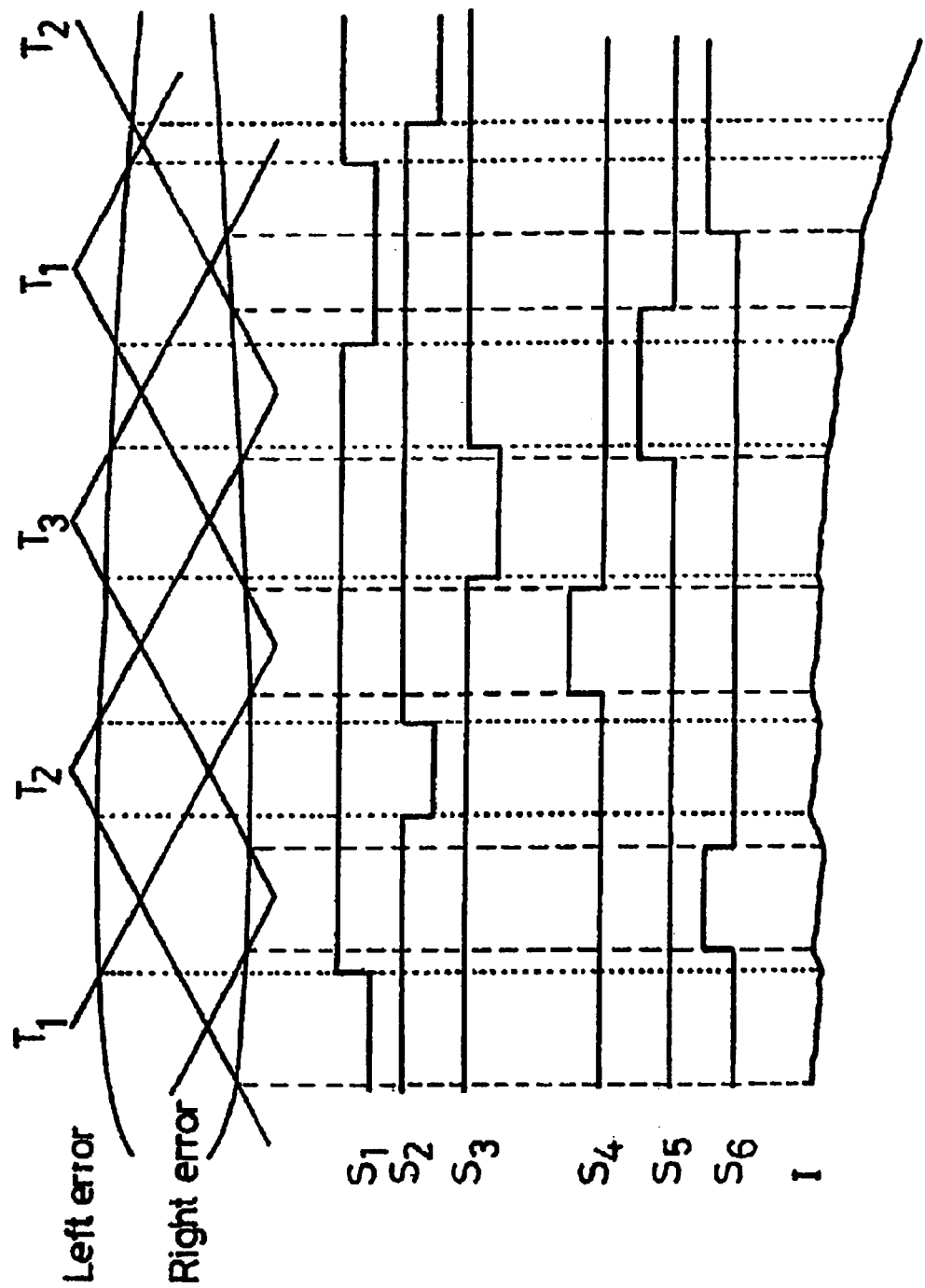
FIG. 7 is a schematic waveform diagram showing the output current I to the load for an amplifier having three pairs of half-bridge networks.

In FIG. 6, the half-bridge networks (denoted generally as ½) are arranged in a push-pull configuration with N pairs of half-bridges, one of each pair being provided on either side of the load to define a left channel and a right channel. Taking the left channel, each half-bridge has an output S which is passed through an inductance L before the output is combined at a summation point (or rail) to produce the channel output supplied to the load. The combined output of the left and right channels to the load, which has a capacitor C connected in parallel thereto, gives the system output current I. In the embodiment of the invention, each channel has three half-bridges, the left channel having switching profiles $S_1$, $S_2$, $S_3$ and output currents $I_1$, $I_2$, $I_3$, passed through inductors $L_1$, $L_2$, $L_3$ and the right channel has switching profiles $S_4$, $S_5$, $S_6$, and output currents $I_4$, $I_5$, $I_6$ passed through inductors $L_4$, $L_5$, $L_6$. The switching profiles $S_1$, $S_2$, $S_3$, $S_4$ $S_5$, $S_6$, and the system output current characteristics I are shown in FIG. 7 which is discussed in more detail hereinafter, The amplifier topology preferred is such that it may be separated into discrete elements including the power stage, supplying the load, the voltage feedback circuit, the current feedback circuit and the PWM circuitry. The power stage of the circuitry is comprised of six identical half-bridge structures, each of which comprises two IGBT's as shown for example in FIG. 5B. In this arrangement, when the top device is "ON" (in a low impedance state), the opposing device is "OFF" (in a high impedance state), and vice versa. The supply to each half-bridge is identical and not connected to ground (earth).

Figure 8:
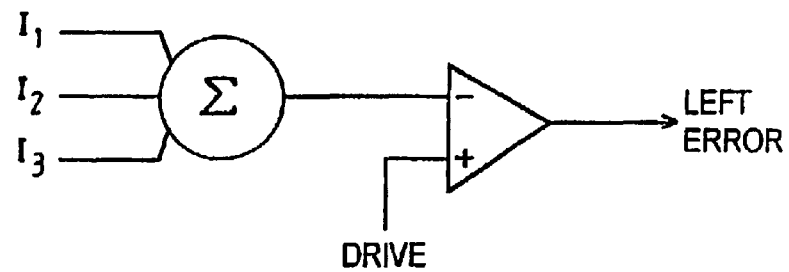
FIG. 8 is a schematic diagram of a current feedback circuit for generating an error signal.

The currents $I_1$, $I_2$, $I_3$, $I_4$, $I_5$, $I_6$, through the six inductors $L_1$, $L_2$, $L_3$, $L_4$, $L_5$, $L_6$ are measured by current sensors, giving signals which are then summed, as shown in FIG. 8, for comparison with a drive signal. The currents $I_1$, $I_2$, $I_3$ on the left channel are summed and compared to produce a "left error" signal. An identical process occurs with the currents $I_4$, $I_5$, $I_6$ on the opposite side, read through the corresponding inductors $L_4$, $L_5$, $L_6$. The current signals are summed as before for comparison but are inverted before producing the "right error" signal.

Referring now to FIG. 7, the "left error" and "right error" signals are compared, with three triangular waves $T_1$, $T_2$, $T_3$ which are equally spaced in time. When the left error signal exceeds the first triangular wave $T_1$ the output of the first half-bridge of the left channel $S_1$ is driven high, and when the signal falls below the triangular wave $T_1$ the output $S_1$ is driven low. This is true also for the signal profiles of the second and third triangular waves $T_2$, $T_3$ and outputs of the second and third half-bridge networks $S_2$, $S_3$, respectively. The right error signal is also compared, as shown in FIG. 7, with the same triangular waves $T_1$, $T_2$, $T_3$, such that when the right error signal exceeds the first triangular wave $T_1$, the output of the first half-bridge of the right channel $S_4$ is driven high. When the signal falls below the triangular wave, the output $S_4$ is driven low. This is also true for the relationship between the second and third triangular waves $T_2$, $T_3$, and the second and third right channel half-bridge outputs $S_5$, $S_6$, respectively.

The inductors $L_1$, $L_2$, $L_3$, $L_4$, $L_5$, $L_6$ facilitate the integration of the sum of the left channel output currents ($I_1+I_2+I_3$) less the sum of the right-hand output currents and the load voltage ($I_4+I_5+I_6+V$). This gives a smoothed output current I, as shown in FIG. 7, with transitions at every half-bridge state change. Thus, the rate of change of inductor current alters six times as often as any of the half-bridge outputs alter. The capacitor C in parallel with the load combines with the individual inductors $L_1$, $L_2$, $L_3$, $L_4$, $L_5$, $L_6$ to form a low pass filter. This ensures that little of the overall switching frequency is observed at the load.

The drive signal, shown in FIG. 8, is created by subtracting the load voltage V from the input signal. This drive signal is identical for creating both right and left current feedback signals.

There are six current transducers/sensors so the currents through each inductor are measured. In this way any imbalance in the current levels in the inductors can be calculated. If any inductor has any more current in it than the overall mean (average current), then the associated half-bridge has its timing adjusted to correct for this imbalance. This process is achieved as is the overall control strategy using a digital control method.

Figure 9:
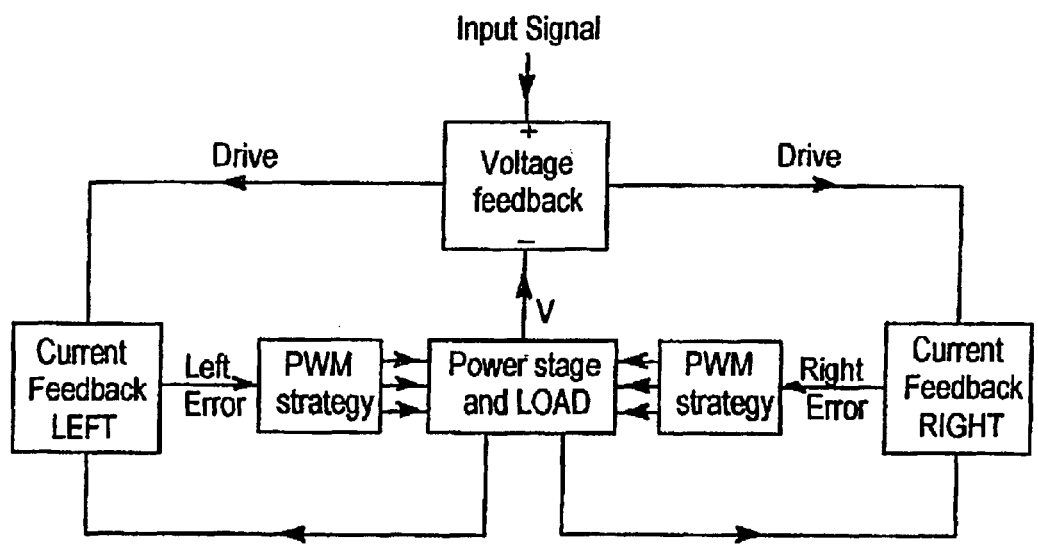
FIG. 9 is a schematic overview of a high frequency switch-mode power amplifier according to the invention.

The overall strategy of the amplifier is shown in FIG. 9. The input signal is used to create left and right channel "drive" signals in a voltage feedback circuit. The drive signals are passed to the current feedback circuits, as illustrated in FIG. 8. The error signals are passed to timing circuits shown as "PWM strategy" which generates timing signals to the half-bridge switching elements.

If higher power levels are required than can be obtained from one set of six half-bridges then multiple units can be used. This is possible by paralleling units inside the voltage feedback loop such that each unit receives the same drive signal and is connected identically to the load. The current feedback loops ensure that all units carry identical current loads. In this way, any quantity of units may be paralleled.

It will be appreciated that at lower speeds, higher currents can be switched with greater ease. This also facilitates the use of cheaper high power switching elements. The topology of the invention facilitates production of a power amplifier having a kVA rating double that previously available at substantially the same cost. Additionally, as specified in the preferred embodiment, an amplifier with two sets of three half-bridges, each operating at 25 kHz, gives them apparent operating frequency of 150 kHz at the load. Cheaper switching elements operating at slower speeds and capable of handling high currents can be used as speeds well within their optimum range, decreasing the incidence of component failure and increasing the overall reliability of the amplifier.

Radio frequency interference is also reduced as the reduced switching frequency allows lower voltage transients (dv/dt) without substantially affecting efficiency.

The term "electromagnetic load" as used herein may be applied to audio speakers, electric motors to which high quality waveforms are to be applied and signal generating devices used in connection with vibration and acoustic testing. The invention is however more particularly directed to electro-dynamic shakers used for vibration testing.

It will of course be understood that the invention is not limited to the specific details described herein, which are given by way of example only, and that various modifications and alterations are possible within the scope of the invention.

What is claimed is:

1. A switch mode power amplifier circuit connectable to an electromagnetic load, the circuit comprising:
    a plurality of half-bridge networks having outputs combined for summation at a summation point, the half-bridge networks being switched to provide power outputs sequenced to generate an interlaced output at the summation point which is operably connected to a load so that for a given switching frequency of the networks the operational frequency of the circuit is increased; and
    a current sensor on the output of each half-bridge network so that a current error signal can be derived, in which the error signal is compared with a plurality of waveforms to give a timing signal to regulate the switching of the half-bridge switching elements.

2. A switch-mode power amplifier circuit as claimed in claim 1, in which the sequencing of the half-bridge outputs to generate an interlaced output facilitates the reduction of the switching frequency of individual switching components within the half-bridge while at least maintaining the overall operational frequency of the circuit.

3. A switch-mode power amplifier circuit as claimed in claim 1, in which, for N half-bridges operating at $f$kHz, the overall operational frequency of the circuit is $Nf$kHz.

4. A switch mode power amplifier circuit as claimed in claim 1, in which, for N half-bridges, the switching frequency of the individual switching elements of a system operating at $f_0$kHz.\ may be reduced by a factor of N.

5. A switch-mode power amplified circuit as claimed in claim 1, in which a feedback path is provided so that a feed back signal is generated across a load.

6. A switch-mode power amplifier circuit as claimed in claim 5, in which the summation of the half-bridge network outputs includes the feedback signal.

7. A switch-mode power amplifier circuit as claimed in claim 5, in which, where the operating frequency of the circuit is increased, further feedback may be imposed on the circuit to reduce distortion.

8. A switch-mode power amplifier circuit as claimed in claim 1, in which the half-bridge networks are arranged in a push-pull configuration about a load, the configuration defining a left and right channel for which a power drive signal may b derived to generate timing signals for controlling individual switching elements of the half-bridge networks.

9. A switch-mode power amplifier circuit as claimed in claim 1, in which a timing strategy is used to ensure current sharing between the networks.

10. A switch-mode power amplifier circuit as claimed in claim 1, in which each half-bridge network comprises two switching components in opposite switched states.

11. A switch-mode power amplifier circuit as claimed in claim 10, in which the states are a high impedance state representing "OFF" and a low impedance state representing "ON".

12. A switch-mode power amplifier circuit as claimed in claim 1, in which an identical supply voltage is supplied to each half-bridge network.

13. A switch-mode power amplifier circuit as claimed in claim 1, in which the switched power outputs of the half-bridge networks are provided with an in-line inductance.

14. A switch-mode power amplifier circuit as claimed in claim 13, in which the inductance is identical for each output.

15. A switch-mode power amplifier circuit as claimed claim 1, in which an out put filter stage is provided on the circuit at least part of which is shunt-connected across a load in use.

16. A switch-mode power amplifier circuit as claimed in claim 1, in which the switching of the half-bridge switching components is controlled using Pulse Width modulation (PWM) techniques.

17. A switch-mode power amplifier circuit as claimed in claim 1, in which the use of a plurality of power devices operating in an interlaced fashion in order to increase the apparent operating frequency of the system, allows more feedback to be imposed on the system.

18. A switch-mode power amplifier circuit as claimed in claim 1, in which the system is used to drive a load, particularly an electromagnetic load, using high power, low distortion waveforms with a high degree of control.

* * * * *